(12) United States Patent
Damon

(10) Patent No.: US 7,464,308 B2
(45) Date of Patent: Dec. 9, 2008

(54) CAM EXPECTED ADDRESS SEARCH TESTMODE

(75) Inventor: Tim Damon, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 238 days.

(21) Appl. No.: 10/755,409

(22) Filed: Jan. 13, 2004

(65) Prior Publication Data

US 2005/0166102 A1    Jul. 28, 2005

(51) Int. Cl.
 *G01R 31/28* (2006.01)
(52) U.S. Cl. ...................................... 714/718
(58) Field of Classification Search .................. None
See application file for complete search history.

(56) References Cited

U.S. PATENT DOCUMENTS

| | | | | |
|---|---|---|---|---|
| 3,751,649 A * | 8/1973 | Hart, Jr. | ...................... | 714/718 |
| 4,680,760 A * | 7/1987 | Giles et al. | .................. | 714/718 |
| 6,167,542 A * | 12/2000 | Chakraborty et al. | ....... | 714/720 |
| 6,304,989 B1 * | 10/2001 | Kraus et al. | .................. | 714/733 |
| 6,539,324 B2 * | 3/2003 | Miyatake et al. | ............ | 702/117 |
| 6,609,222 B1 * | 8/2003 | Gupta et al. | ................. | 714/733 |
| 6,785,846 B2 * | 8/2004 | Li | ............... | 714/30 |
| 6,909,651 B2 * | 6/2005 | Clark et al. | ................. | 365/201 |
| 6,988,164 B1 * | 1/2006 | Wanzakhade et al. | ....... | 711/108 |
| 7,010,741 B2 * | 3/2006 | Foss et al. | ................... | 714/805 |
| 7,017,089 B1 * | 3/2006 | Huse | .......................... | 714/718 |
| 7,171,595 B1 * | 1/2007 | Huse et al. | .................. | 714/718 |
| 2002/0108073 A1 * | 8/2002 | Hughes | ......................... | 714/7 |
| 2005/0050408 A1 * | 3/2005 | Kaginele | .................... | 714/718 |
| 2005/0076273 A1 * | 4/2005 | Mantri | ....................... | 714/718 |

\* cited by examiner

*Primary Examiner*—Cynthia Britt
*Assistant Examiner*—Steven D Radosevich
(74) *Attorney, Agent, or Firm*—Dickstein Shapiro LLP

(57) ABSTRACT

A CAM device that performs operations on-chip during testing. The CAM device can, for example, include circuitry that compares search results with an expected address to determine whether the expected address is defective. The CAM can be tested by applying search data and the expected address to the CAM at the same time, and determining if a match occurs at the expected address. In another approach, a reset match enable is used to limit the search to only a CAM memory location that has been written to, thereby limiting the test search to only the location containing test data.

21 Claims, 10 Drawing Sheets

CAM EXPECTED ADDRESS SEARCH TESTMODE

FIELD OF THE INVENTION

The present invention relates generally to content addressable memory (CAM) and particularly the testing of CAM memory devices.

BACKGROUND OF THE INVENTION

An essential semiconductor device is semiconductor memory, such as a random access memory (RAM) device. A RAM device allows a memory circuit to execute both read and write operations on its memory locations. Typical examples of RAM devices include dynamic random access memory (DRAM) and static random access memory (SRAM).

Another form of memory is the content addressable memory (CAM) device. A CAM is a memory device that accelerates any application requiring fast searches of a database, list, or pattern, such as in database machines, image or voice recognition, or computer and communication networks. Searches in CAM devices are performed by simultaneously comparing the desired information (i.e., data in a comparand register) against an entire list of pre-stored entries. As a result of their unique searching algorithm, CAM devices are frequently employed in network equipment, particularly routers and switches, computer systems and other devices that require rapid content searching.

FIG. 1 is a block diagram of an exemplary CAM device 100, which includes a CAM array 110 for storing the database; a match detection circuit 120, which may be embedded in CAM array 110, for detecting matches; a comparand register 160 for storing data to be compared with data stored in array 110; optionally a priority encoder 130 for selecting and outputting an indication of which of the array locations matching data in the comparand register 160 has a highest or lowest priority; and an address encoder 170 for decoding an address output associated with the priority output of the priority encoder 130. The CAM device also includes a controller 140, for controlling the operation of the CAM array 110, match detection logic 120, and priority encoder 130, as well as for interfacing the CAM device 100 to other devices via the data 150a, address 150b, and control 150c lines. Commercially available CAM devices may support, for example, searching a 136-bit wide data sample against a database having up to 16,384 entries. Commercially available CAM devices may be searched at rates up to 100 million searches per second. This ability for CAMs to quickly search relatively wide data words against relatively large databases at high speeds makes them highly useful.

In order to perform a memory search in the above-identified manner, CAMs are organized differently than other memory devices (e.g., DRAM and SRAM). For example, data is stored in a RAM in a particular location, called an address. During a memory access, the user supplies an address and reads into or gets back the data at the specified address. In a CAM, however, data is stored in locations in a somewhat random fashion. The locations can be selected by an address bus, or the data can be written into the first empty memory location. Every location could have a pair of status bits that keep track of whether the location is storing valid information or is empty and available for writing.

Information stored in a CAM memory location is found by comparing it with an input data value held in the comparand register. A local match detection circuit can compare all or some of its bits with the input data value. When the content stored in a CAM memory location does not match the data in the comparand register, a local match detection circuit returns a no match indication. When the content stored in a CAM memory location matches the data in the comparand register, the local match detection circuit returns a match indication. If one or more local match detect circuits return a match indication, the CAM device returns a "match" indication. If there are multiple matches, the CAM may also return a multiple match (MMatch) indication. Otherwise, the CAM device returns a "no match" indication. In addition, the CAM may return an address associated with the desired match data, or if a plurality of memory locations has match data, an address associated with a highest or lowest priority match can be identified with the priority encoder. Thus, with a CAM, the user supplies the data and gets back an address when there is a match.

FIG. 3 is a flowchart describing a conventional test procedure associated with CAM device 100 in which unique data and a search command is applied to CAM device 100 to determine if a match occurs. If a match occurs, the address where the match occurs must be determined to verify whether or not a memory location of CAM device 100 is operating correctly. At segment 1000, a unique data entry is written to each memory address in an array of CAM device 100. At segment 1100, a search of the CAM device 100 is initiated, by applying a search command, which searches for a unique data entry that should reside in the CAM array. At segment 1200, a determination of whether the test data resides in the CAM array occurs. If the data is found in the CAM array at segment 1200, CAM device 100 is queried at segment 1300 to retrieve the address at which the data was found. If the data is not found in the CAM array, the procedure continues to segment 1450 where the failing memory location is marked for subsequent repair by the memory tester.

As illustrated at segment 1400, a determination of whether the test data was found at the correct address occurs. The address retrieved at segment 1300 is compared to the address where the data was written to determine if the data was found at the correct memory location. If the address retrieved is the same as the written address then CAM 100 has functioned properly. If the addresses are not the same, then an error has occurred at the written address, which is marked for subsequent repair as shown at segment 1450. In addition, the retrieved address could be marked for repair. As shown in segment 1500, this procedure is repeated for all memory locations intended to be tested in CAM device 100 by returning to segment 1100 once an individual memory location has been tested. At segment 1600, once the testing is complete, the memory locations of the CAM device 100 that failed the test procedure are repaired and retested to validate the repair of the memory location.

Testing of CAM devices is extremely time consuming and costly. In particular, CAMs have to be tested for their ability to match a test data value with different stored data values. The conventional means of testing CAM devices is performed by loading the CAM memory locations with known data and the repetitive inputting of data as a search argument and outputting the address associated with the location where the data is found (if the data is stored in the CAM). This repetitive searching for matching CAM entries in successive operational clock cycles is illustrated by the timing diagram in FIG. 2.

Accordingly, there is a need for a more efficient and less expensive means of testing CAM devices.

BRIEF SUMMARY OF THE INVENTION

The present invention provides methods and apparatus for testing a CAM device to determine whether the CAM device is operating correctly. In a first exemplary embodiment, the CAM is tested by applying search data and an expected memory location address to the CAM at the same time, and determining if a match occurs at the expected address. Unlike conventional testing methods, pipelined searches are possible. In a second exemplary embodiment, the search is limited to a CAM memory location that has been written to, thereby limiting the test search to a location containing data for comparison.

Some exemplary embodiments of the invention involve tests that match an address resulting from a search with an expected address within the CAM device allowing more efficient use of tester resources since the CAM device does the address comparison. Other exemplary embodiments determine whether an enabled memory location correctly retrieves test data.

The foregoing and other features and advantages of the invention will become more apparent from the detailed description of the exemplary embodiments of the invention given below in connection with the accompanying drawings.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

Figure 1:
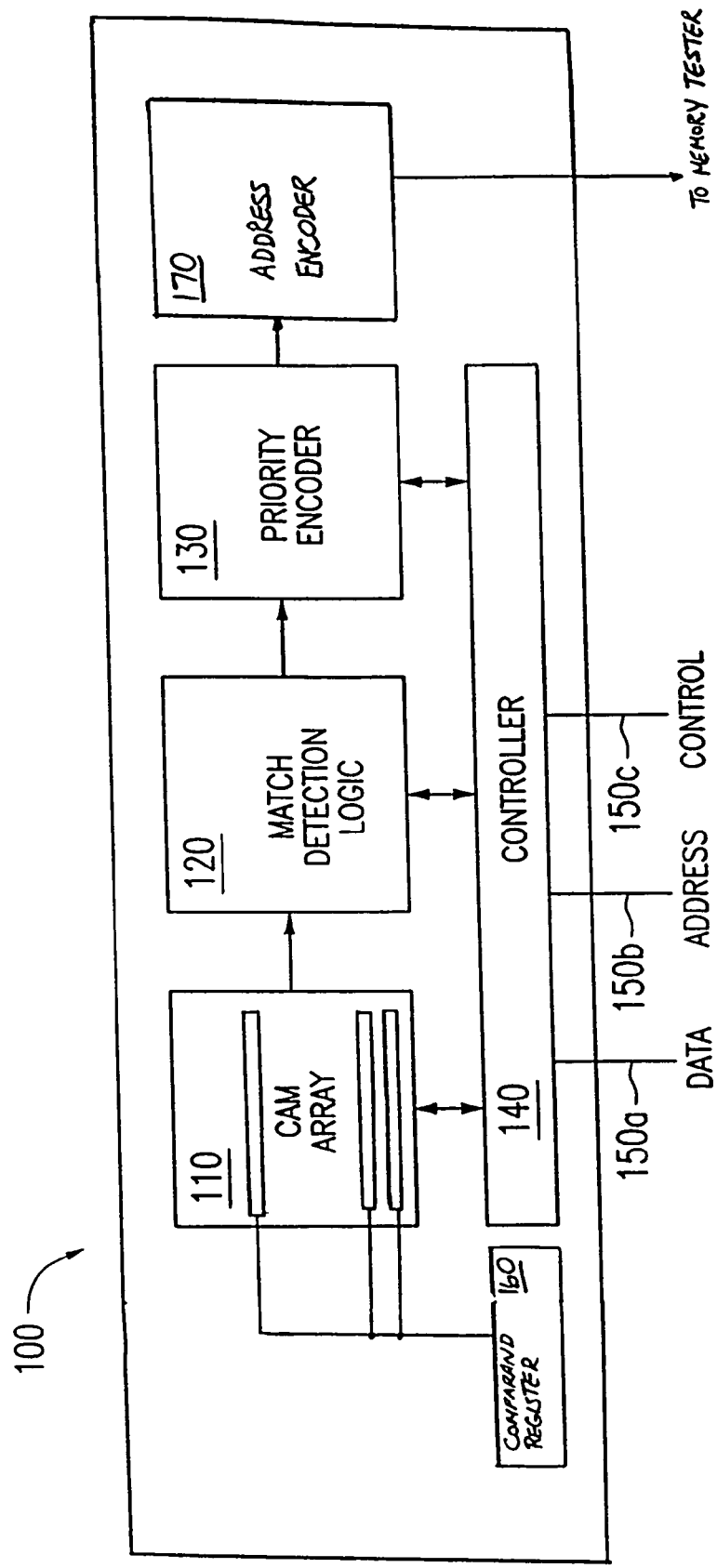
FIG. 1 is a block diagram of a content addressable memory (CAM) device.
Figure 2:
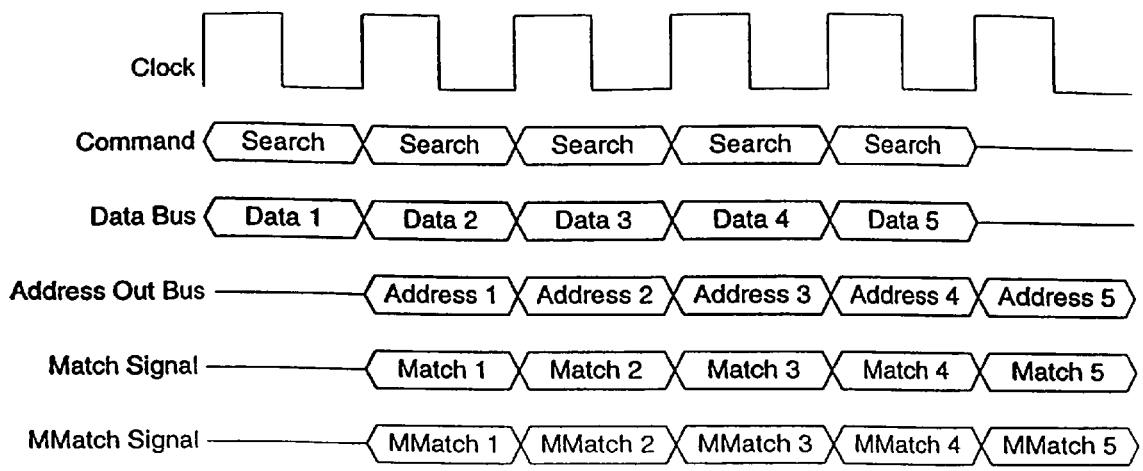
FIG. 2 is a timing diagram showing signal timing of a CAM device that incorporates a separate address out bus during a search.
Figure 3:
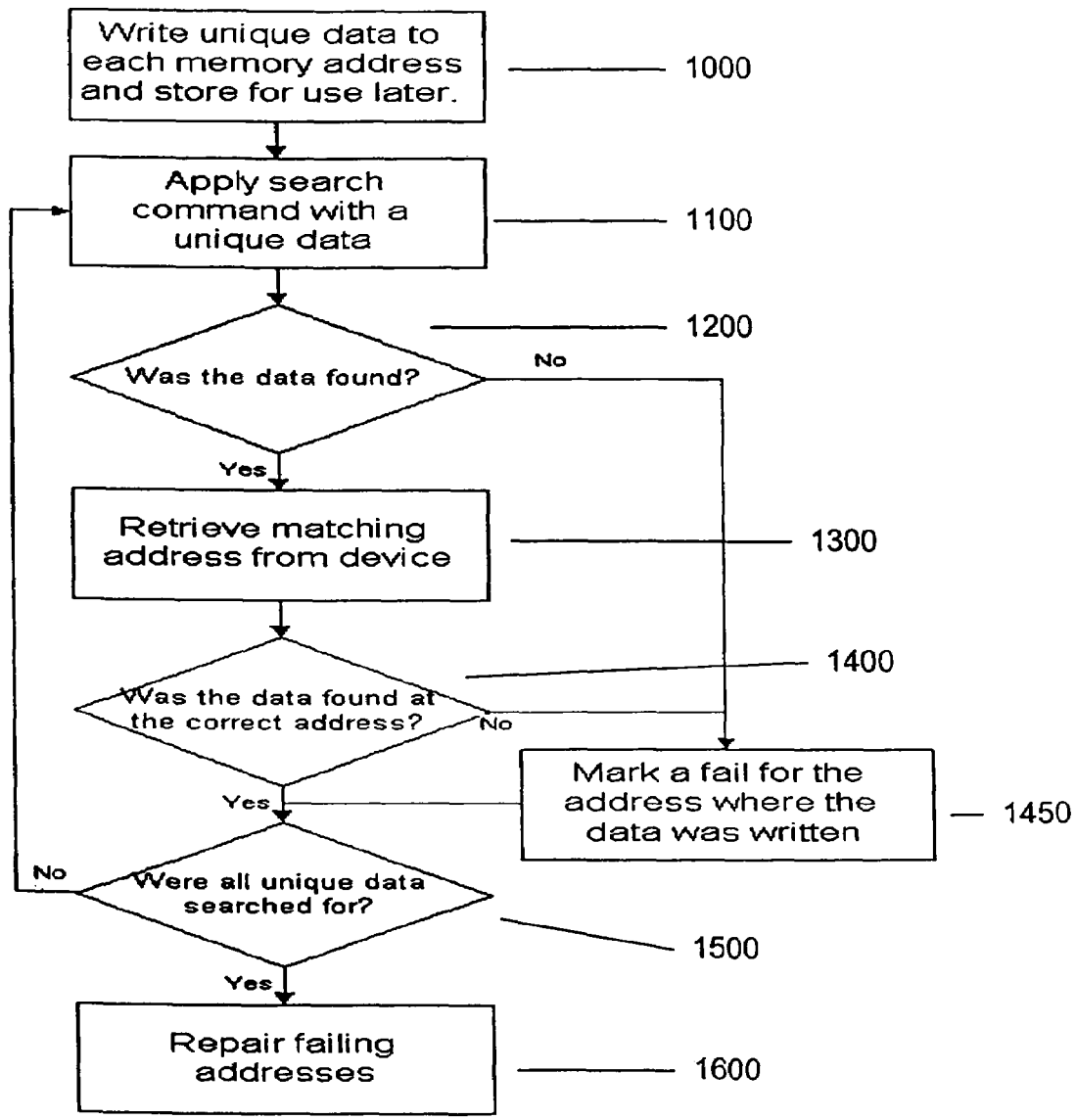
FIG. 3 is a flowchart showing a typical CAM testing procedure for testing a conventional CAM device.
Figure 4:
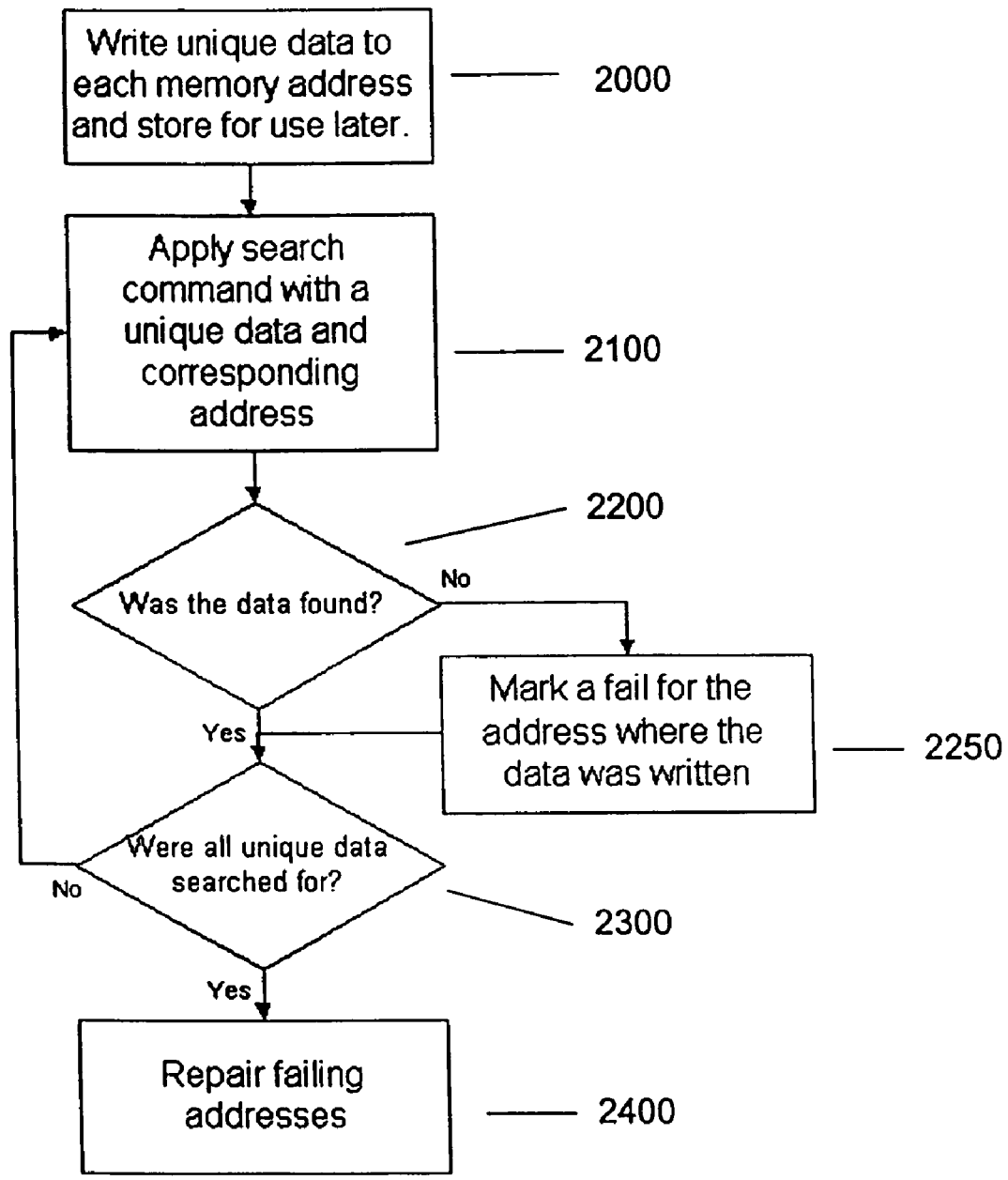
FIG. 4 is a flowchart showing an exemplary CAM testing procedure according to a first embodiment of the invention.

FIG. 4 is a flowchart illustrating an exemplary test procedure according to a first embodiment of the invention. The testing may be performed within the CAM under control of a memory tester (not shown), which provides commands, data, and addresses to the CAM controller 140 (FIG. 1). In response controller 140 executes the commands. By performing the procedure in FIG. 4, the memory tester (not shown) can verify that the CAM is operating correctly. At segment 2000, a unique data entry is written to each memory address of the CAM array. At segment 2100, a search of the CAM device is initiated by applying a search command with a search data entry that should reside in the CAM array (i.e., data to be searched and found). In addition, at segment 2100, the expected address at which the data should be found in the CAM array is retrieved from, for example, a storage register in the memory tester, and is provided to the CAM device at the time a search command is issued. At segment 2200, circuitry in the CAM device determines whether the test data has been found in the CAM array at the expected address. If the data is found at the expected address, a match has occurred and a signal is provided indicating that a match has occurred. At segment 2250, if the data is not found at the expected address, the expected address is marked, indicating that the location must be repaired. At segment 2300, a determination of whether all intended memory test locations have been tested occurs. If there are remaining locations to be tested, the test procedure returns to segment 2100.

Once the test is completed, the CAM locations that failed (segment 2250) during testing are repaired, at segment 2400, using techniques such as, for example, repairing the memory location using CAM controller 140, using redundant memory locations in place of memory locations that fail or just not using failed memory locations during normal CAM operation.

Since the test of FIG. 4 provides the address location intended to be tested when the memory tester issues a search command, time is saved since the comparison of an expected address location and a matching location is performed on chip. In contrast, conventional techniques use additional time, after a match has occurred, querying the CAM device to determine where the unique data resides in order to compare the returned address with the write address to verify correct operation of the CAM device. Since comparison occurs within the CAM device itself, external tester resources associated with matching a result address with a write address are not required, freeing these resources for other uses, and making the testing of the CAM circuit more efficient. In addition, the data and address used in the search and comparison phase of the test procedure can be provided by a memory tester for multiple memory locations and addresses in a sequence allowing pipelined, multiple match, testing.

Figure 5:
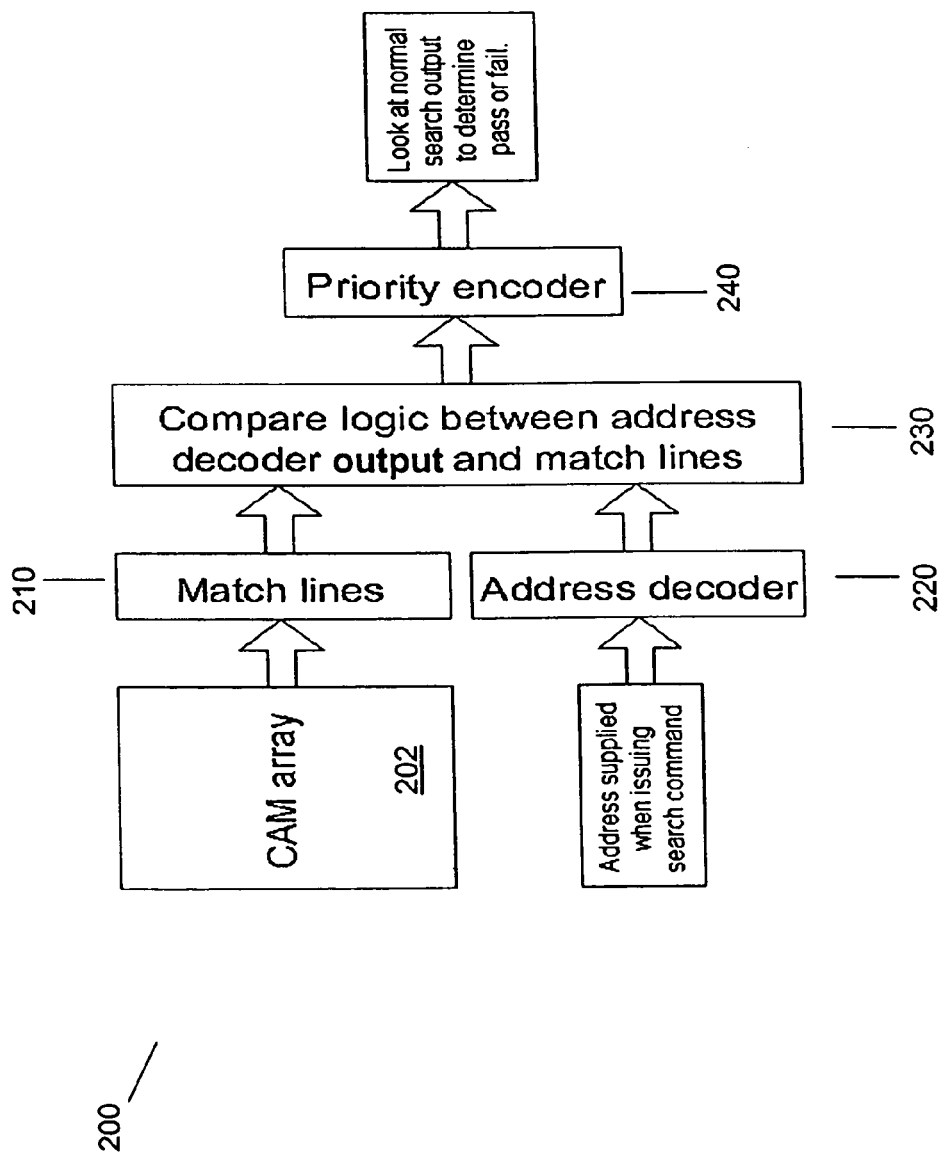
FIG. 5 is a schematic block diagram of a CAM in which the procedure of FIG. 4 can be performed.
Figure 9A:
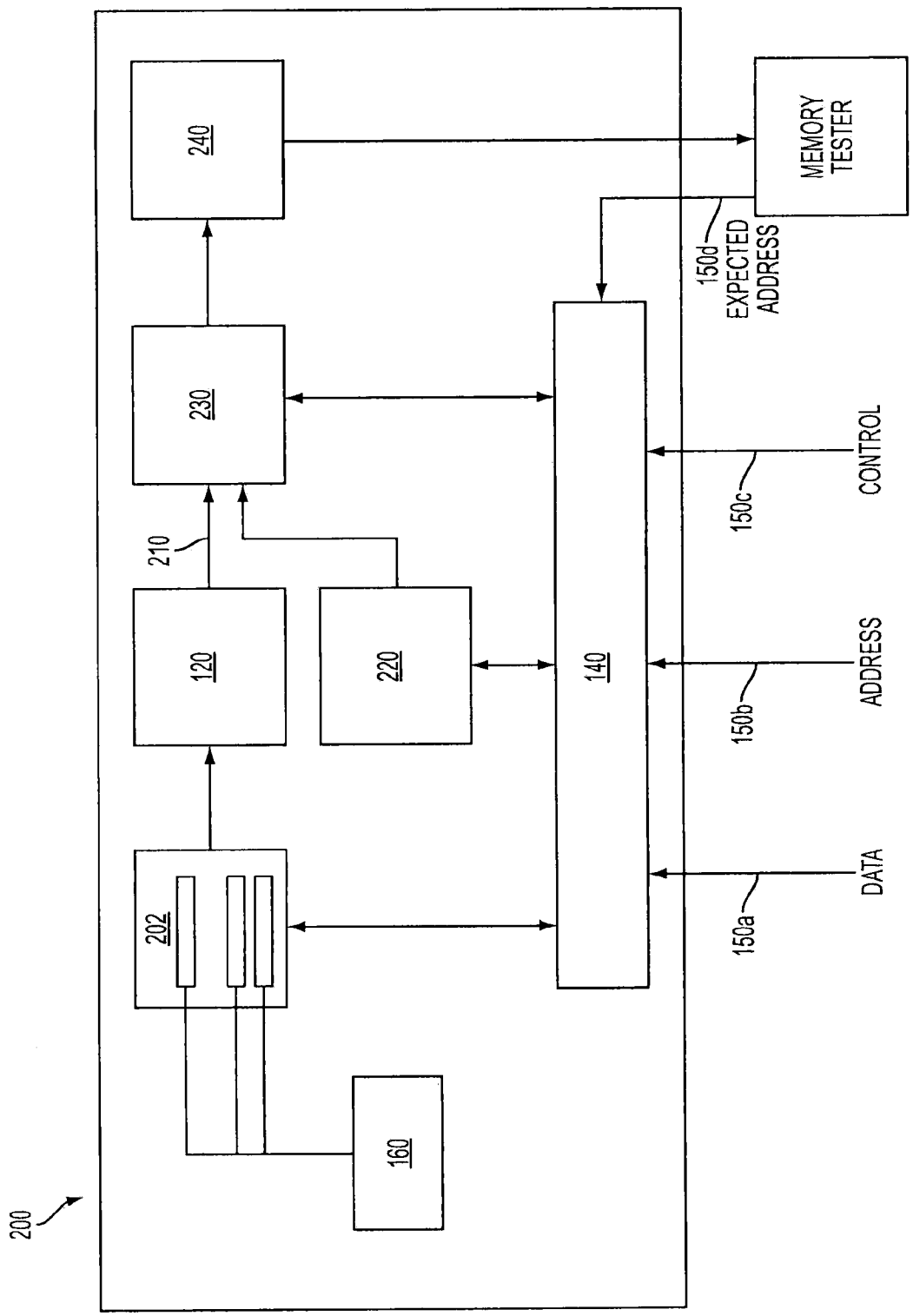
FIG. 9A is a block diagram of a CAM device in accordance with an embodiment described herein.
Figure 9B:
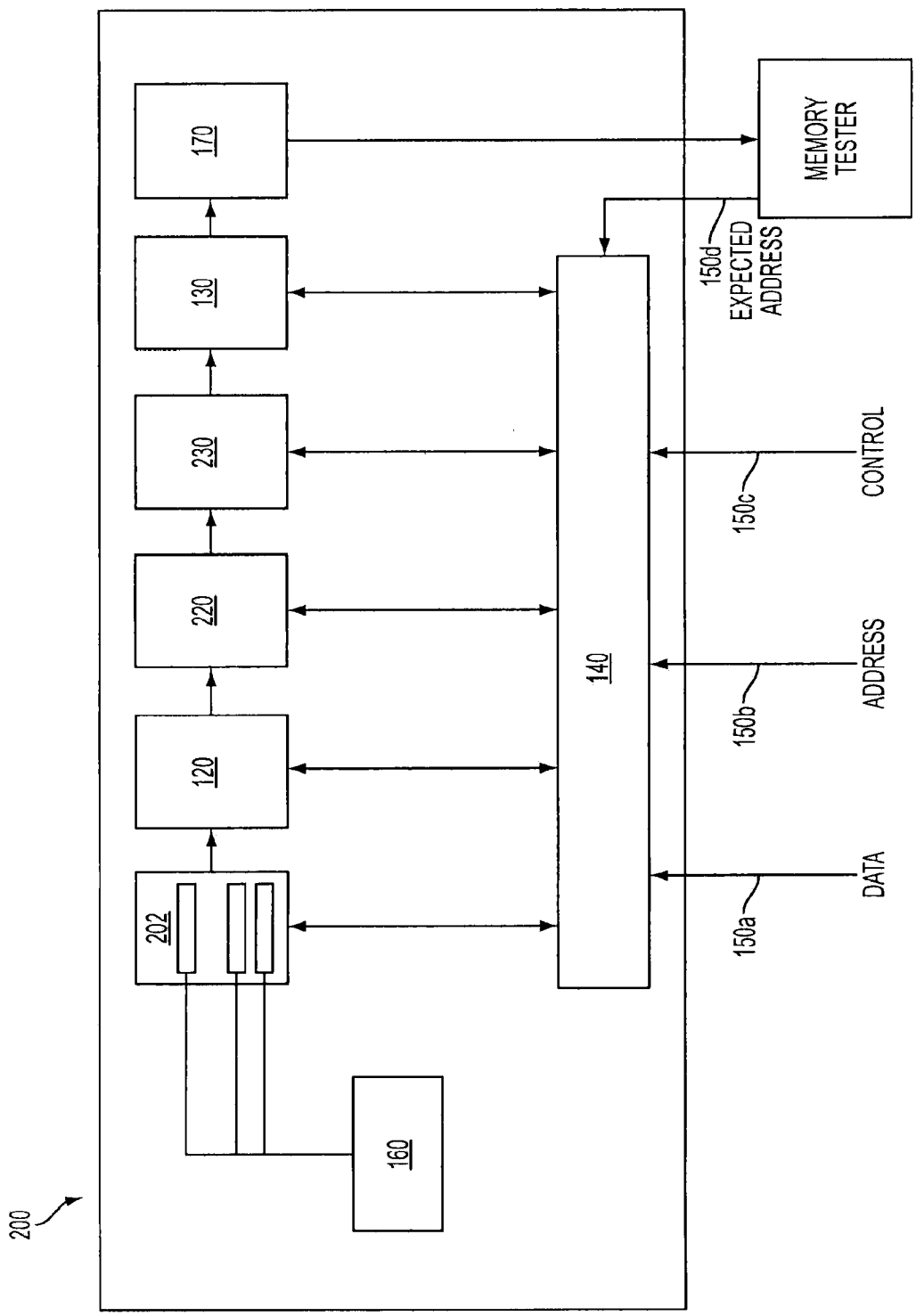
FIG. 9B is a block diagram of a CAM device in accordance with another embodiment described herein.

FIGS. 5, 9A and 9B are block diagrams illustrating components of CAM 200 in which the test procedure of FIG. 4 can be performed under control of controller 140 in response to signals from memory tester (not shown in FIG. 5, but shown in FIGS. 9A and 9B) received through data 150a, address 150b, control 150c, and expected address 150d lines. Controller 140 provides control signals to each component as appropriate.

With regard to the first embodiment, as illustrated in FIG. 5 and more fully illustrated in FIG. 9A, a unique data entry is written to each memory location in CAM array 202 (FIG. 9A only differs from FIG. 5 in that it illustrates a more complete block diagram of CAM 200). In response to a search command with data and an expected address from the memory tester, controller 140 provides signals so that CAM array 202 searches for a memory location at which the data is stored. Concurrently, controller 140 provides the expected address of the memory location in the CAM array intended to be tested to an address decoder 220. The memory locations that contain the unique data entry will indicate that a match has occurred. The results of the search are output to match lines 210, which are input to compare logic block 230. The expected address decoded by the address decoder 220 is also input into compare logic block 230 and compared to the match lines 210 to determine if a match has occurred at the CAM location intended to be tested. As illustrated in FIG. 9B, address decoder 220 and compare logic block 230 could be placed between match detection logic 120 and priority encoder 130 of FIG. 1 in a modification of CAM device 100. Compare logic block 230 could, for example, be an array of AND gates enabling a single match line, which corresponds to the expected address from address decoder 220.

The results of the comparison between the two lines for each memory location are input into a priority encoder 240, and priority encoder 240 provides match and multiple match signals. These signals are subsequently output to the memory tester to determine if the CAM location being tested is operating correctly.

Figure 6:
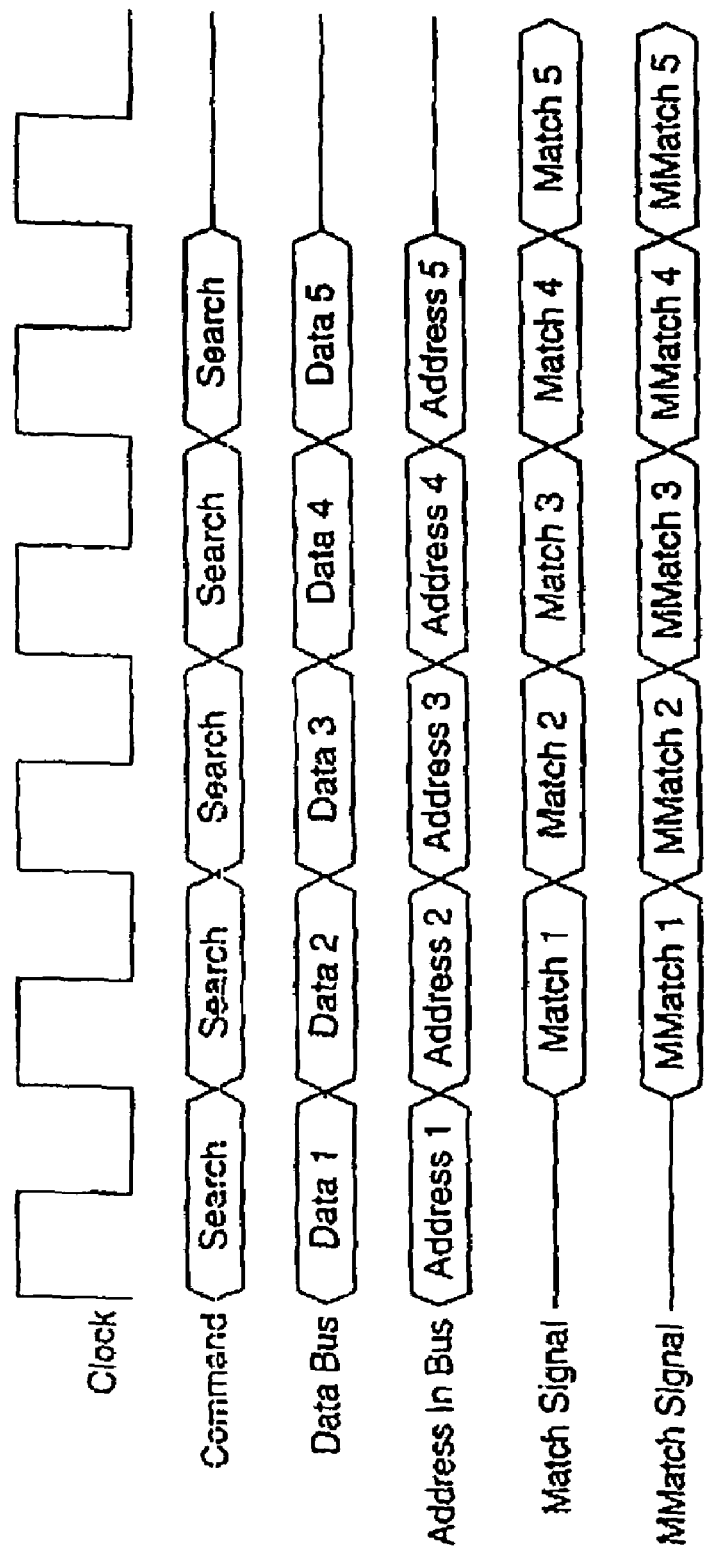
FIG. 6 is a timing diagram showing signal timing of a CAM in which the procedure of FIG. 4 is performed.

Exemplary signal timing for a pipelined version of the first embodiment is illustrated in FIG. 6. First data, a first expected address and a first search command are input during the first clock cycle. During the next clock cycle, the CAM device determines from the match and multiple match signals of priority encoder 140 whether there is a match or multiple matches. The match and multiple match signals can both be provided by controller 140 to the memory tester. If the match signal is high, the expected address passed the test; if the match signal is low, the expected address failed, and if the multiple match signal is high, there is possibly a defect in address decoder 220 or priority encoder 140, which would preclude further testing. A multiple match could also occur if a data input/output line (DQ) within an address fails. In addition, during this same clock cycle, second data, a second expected address and a second search command are input into the CAM device, resulting in pipeline searching. Pipeline searches occur when additional instructions are input into a device before the output of the previous instruction is completed. FIG. 6 illustrates a pipelined search of five instructions.

Figure 7:
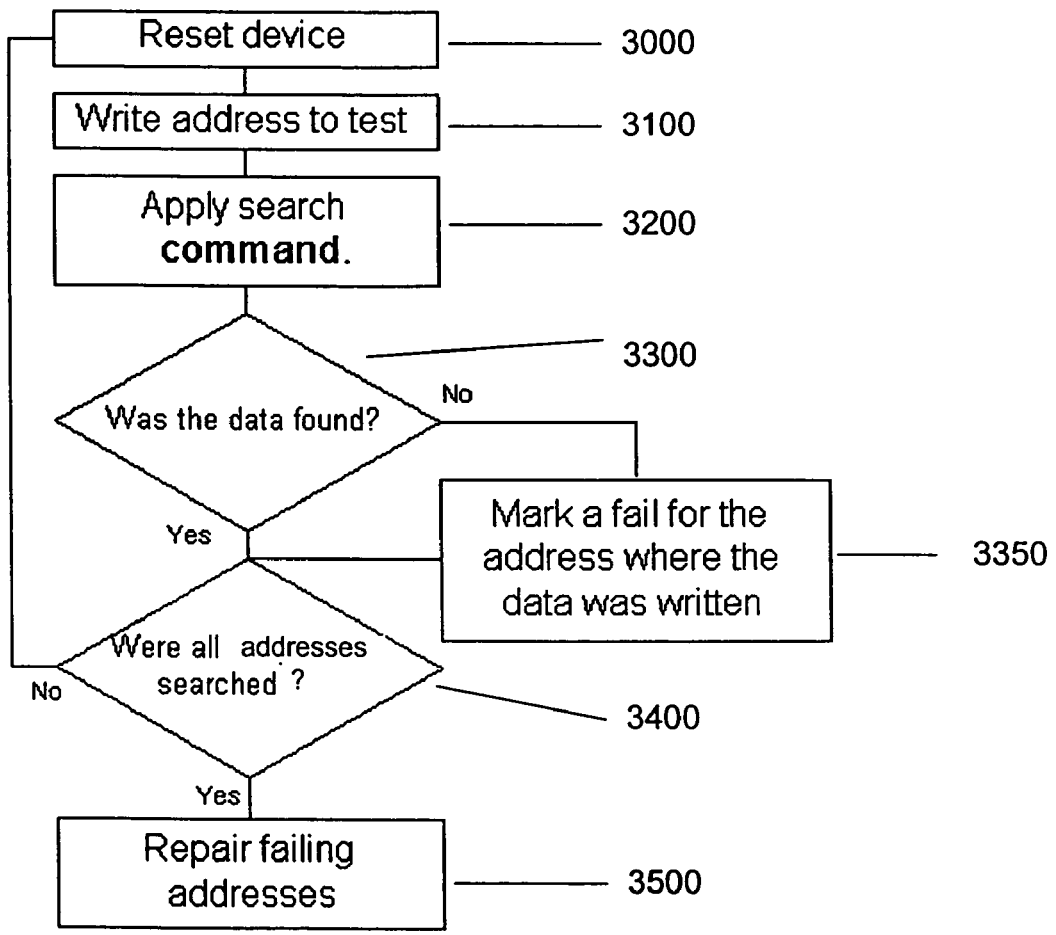
FIG. 7 is a flowchart showing an exemplary CAM testing procedure according to a second embodiment of the invention.

FIG. 7 is a flowchart describing a test procedure according to a second embodiment of the invention. The procedure of FIG. 7 can be performed by a modified CAM controller 140 (FIG. 1) in response to one or more commands from a memory tester (not shown). For example, each memory location of the CAM array has a match enable bit that is set when the location is written and cleared by reset. Each memory location's match line could be ANDed with the match enable to obtain the memory location's output bit.

At segment 3000, controller 140 resets the CAM device, clearing all match enables for the locations in the CAM array. At segment 3100, controller 140 provides signals so that a unique data entry, such as from a register, is written to the particular memory location intended to be tested, such as from an internal address counter. Since a memory location of the CAM array is only match enabled once a write command is given for the memory location's particular address, only the memory location intended to be tested is enabled; therefore, only the enabled memory location participates in the test search. At segment 3200, controller 140 provides signals to perform a search of the CAM device for the unique data entry that should reside in the intended test location of the CAM array. At segment 3300, controller 140 determines whether the test data was found, which can only occur if the test data resides in the CAM memory location being tested, since only the location being tested is enabled. If the data is in the test location then priority encoder 130 provides a high match signal indicating that a match has occurred. If the data is not found in the test location, the procedure continues to segment 3350 where the failing memory location's address is marked for repair.

At segment 3400, if multiple memory locations are being tested, the test procedure returns to segment 3000 once an individual memory location has been tested and segments 3000-3400 are performed for the next location to be tested. At segment 3500, once the testing is complete, the CAM locations that failed the test procedure are repaired and retested using techniques as described above.

This test procedure is similar to the procedure of the first embodiment because it does not require address comparisons outside the CAM device. Consequently, external tester resources normally devoted to such operations can be devoted to other uses, thereby making the testing of the CAM circuit more efficient.

Figure 8:
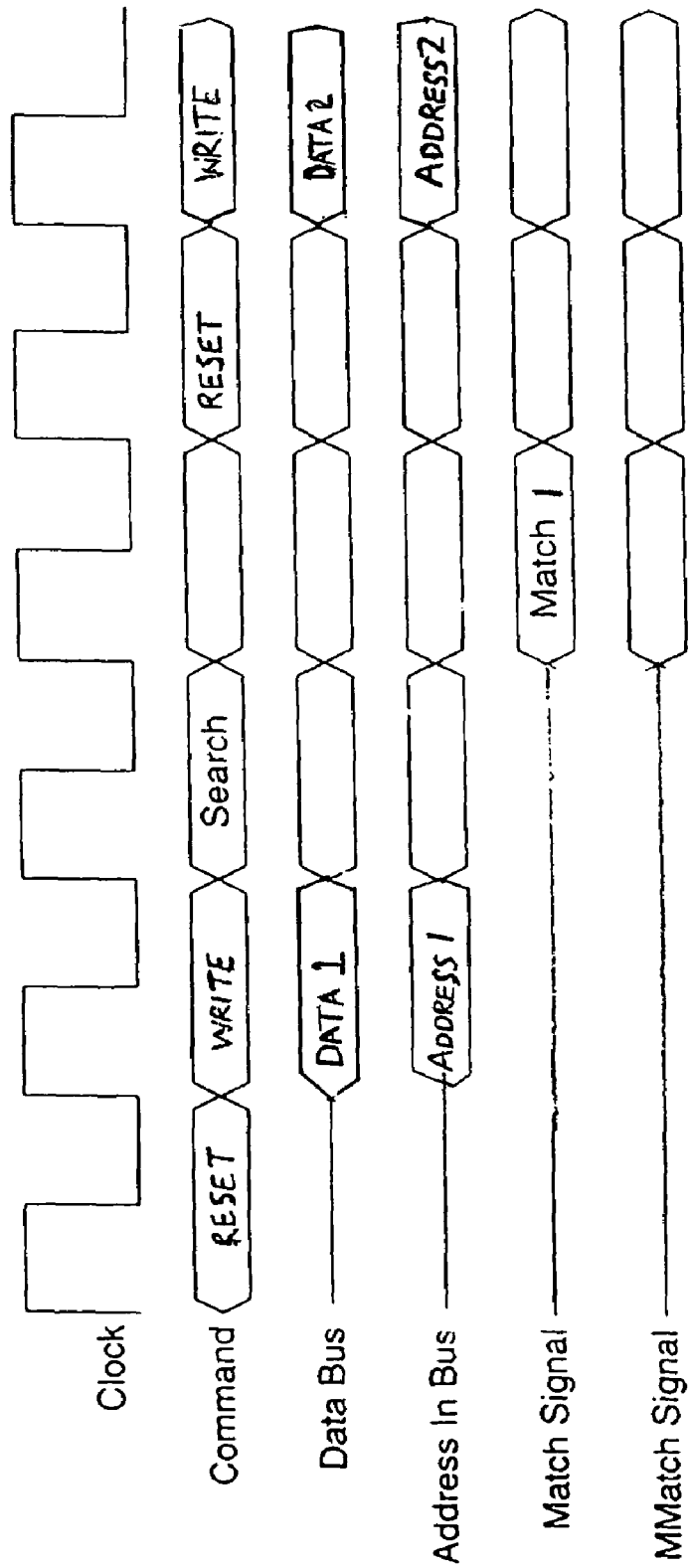
FIG. 8 is a timing diagram showing signal timing of a CAM in which the procedure of FIG. 7 is performed.

Exemplary signal timing for the second embodiment is illustrated in FIG. 8. First, the entire CAM array is reset during the first clock cycle. Next, a write command is issued with test data and the address of a memory location intended to be tested during the second clock cycle. Then, the test data and a search command are input during the third clock cycle. Next, the CAM priority encoder 130 provides a match signal indicating whether a match occurs at the previously written memory location. Multiple clock cycles may be needed to account for latency between the search command and a determination of whether a match has occurred (not shown). Once the match assessment of the memory location intended to be tested is determined, the entire CAM array is reset again and the previous timing is repeated for the next memory location.

The test procedures illustrated by FIGS. 4-8 could be performed entirely within the CAM device itself, as part of a Built in Self Test (BIST). The repair technique could be implemented with components on the chip being tested, using currently known or hereafter developed techniques. If repair is performed by on-chip components, a built-in self test and repair technique could be employed, eliminating the need for an external memory tester to perform a majority of testing and repair of the CAM device.

For a CAM device employing a BIST, the memory tester need only apply a test command to the CAM device and monitor a pass/fail signal received from the CAM device in order to determine if the CAM device is operating correctly. Once the CAM device receives the test command from the memory tester, the CAM device implements address and data generation and conducts test procedures as described in FIGS. 4-8. If the CAM device fails a test procedure segment, the device will issue a fail signal to the memory tester in order to mark the memory location for later repair.

The BIST could also include a self repair procedure which would attempt to repair a failing CAM memory location using, for example, redundant memory locations in place of memory locations that fail, or any electrical enabling method used to repair such failures. Thus, CAM devices returning a failure signal to the memory tester are those devices that could not be repaired.

CAM devices are useful in a variety of information technology applications. For example, CAMs are useful in router applications. Routers may be used in a communications network, for example, part of an Internet backbone. Routers transmit data from one location to another in discrete elements known as a packet. Oftentimes, prior to the packet reaching its final destination, that packet is first received by the router, or some other device. The router decodes that part of the data identifying the ultimate destination and decides which output line and what forwarding instructions are required for the packet. Accordingly, CAMs as described above may be constructed, tested and used for such applications, or similar applications.

While the invention has been described and illustrated with reference to exemplary embodiments, many variations can be made and equivalents substituted without departing from the spirit or scope of the invention. Accordingly, the invention is not to be understood as being limited by the foregoing description, but is only limited by the scope of the appended claims.

What is claimed as new and desired to be protected by Letters Patent of the United States is:

1. A method of testing a content addressable memory device, said method comprising:
    initiating a search and searching for a search data entry within a memory array;
    decoding an expected address at which said search data entry should reside, said decoding of the expected address and the initiating a search step being performed concurrently during a single clock cycle; and
    comparing results of searching with the decoded address to determine whether the search data entry resides at the expected address, wherein said searching, decoding, and comparing steps occur within said device.

2. The method of claim 1, wherein said act of comparing sets a match signal to one state when the search data entry resides at said expected address and to another state when the search data entry does not reside at said expected address.

3. The method of claim 1, wherein if it is determined that the search data entry does not reside at the expected address, a memory location associated with the expected address is repaired.

4. The method of claim 1, wherein multiple memory locations of said device are tested in a pipelined fashion.

5. The method of claim 1, wherein said expected address is stored in a register and is provided for said decoding step.

6. The method of claim 1, wherein the said expected address is provided by an address input bus for said decoding step.

7. A method of testing a content addressable memory device, said method comprising:
    writing a unique item of data to each memory location of the content addressable memory device;
    initiating a search and searching the memory locations for a unique item of data written to a particular memory location;
    decoding an expected address for the particular memory location, wherein said decoding of the expected address is concurrent with said during the same clock cycle as initiating the search; and
    comparing the result of searching with the decoded address to determine whether the item of data resides at the expected address, wherein said searching, decoding, and comparing occur within said device.

8. The method of claim 7, wherein said comparing sets a match signal based on a bit of the decoded expected address and a match line for the particular memory location.

9. The method of claim 7, wherein multiple memory locations of said device are tested in a pipelined fashion.

10. The method of claim 7, wherein if it is determined that the unique item of data does not reside at the expected address, the particular memory location is repaired.

11. A method of testing a content addressable memory device, said method comprising:
    resetting a content addressable memory array;
    writing a search data entry to a single memory location of the content addressable memory device;
    initiating a search of said memory array for said search data entry written in the memory location while concurrently during a single clock cycle provide the memory location's address for comparison with search results; and
    if the search data entry is not found, determining that said single memory location is defective.

12. The method of claim 11, wherein said act of determining sets a match signal to one state when the search data entry resides at said memory location and another state when the search data entry does not reside at said memory location.

13. The method of claim 12, wherein if it is determined that the search data entry does not reside at the memory location, the memory location is repaired.

14. The method of claim 11 in which said act of writing enables a memory location.

15. An integrated circuit content addressable memory device comprising:
    an array of content addressable memory locations for storing one or more unique search data entries;
    an address decoder for decoding an expected address at which one of said one or more unique search data entries should reside;
    a controller for initiating a search for said one of said one or more unique search data entries while concurrently providing the expected address to the address decoder during a single clock cycle; and
    a compare circuit for comparing results of the searching with the decoded address to determine whether said one or said one or more unique search data entries resides at the expected address.

16. The device of claim 15 further comprising a repair circuit that repairs said expected address when the said one of said one or more unique search data entries does not reside at said expected address.

17. An integrated circuit content addressable memory device comprising:
    an array of content addressable memory locations, each with a match line to indicate whether stored data matches search data;
    a test circuit connected to said array, said test circuit testing said array memory locations by storing a unique data entry in each location, searching for search data within the array of memory locations and providing an expected address at which said search data should be stored;
    an address decoder for obtaining a decoded expected address to decode the expected address during the same clock cycle as the searching is initiated; and
    a compare circuit for comparing the match lines with the decoded expected address.

18. The circuit of claim 17 further comprising a repair circuit that repairs locations that fail a test conducted by the test circuit.

19. A test system for testing a content addressable memory device comprising:
    a memory tester for performing a test procedure on said content addressable memory device; and
    a content addressable memory device including:
        an array of content addressable memory locations, each with a match line to indicate whether its stored data matches search data following a search;
        an address decoder for obtaining a decoded expected address to decode the expected address during the same clock cycle as the searching is initiated; and
        a compare circuit, said compare circuit comparing the match lines with a decoded expected address.

20. The system of claim 19 further comprising a repair circuit that repairs locations that fail a test conducted by the test circuit.

21. A method of testing a content addressable memory device, said method comprising:
- writing a unique data entry in each memory location of the memory device; and
- for each memory location's unique data entry:
  - initiating a search of said memory device for said unique data entry written in the memory location while concurrently providing the memory location's address for comparison with search results;
  - determining whether the search results indicate that the unique data entry resides in the memory location and if not, identifying the memory location as failing; and
- repairing the memory locations identified as failing,
- wherein said initiating and determining steps occur within said device during a first clock cycle and said repairing step occurs during a second clock cycle.

* * * * *